United States Patent
Langer

(10) Patent No.: US 9,537,518 B2
(45) Date of Patent: Jan. 3, 2017

(54) POWER SENSING IN WIRELESS SYSTEM

(71) Applicant: Intel IP Corporation, Santa Clara, CA (US)

(72) Inventor: Andreas Langer, Lohhof (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/155,374

(22) Filed: Jan. 15, 2014

(65) Prior Publication Data

US 2015/0372725 A1 Dec. 24, 2015

(51) Int. Cl.
*H04L 25/03* (2006.01)
*H04B 1/04* (2006.01)
*H04W 52/42* (2009.01)
*H04B 17/10* (2015.01)
*H04B 1/525* (2015.01)
*H04B 17/24* (2015.01)

(52) U.S. Cl.
CPC .......... *H04B 1/0475* (2013.01); *H04B 17/102* (2015.01); *H04W 52/42* (2013.01); *H04B 1/525* (2013.01); *H04B 17/24* (2015.01); *H04B 2001/0408* (2013.01)

(58) Field of Classification Search
CPC .. H03F 1/3247; H04L 27/368; H04W 52/0225
USPC ........ 375/297, 295; 370/311; 455/113, 115.3
See application file for complete search history.

(56) References Cited

U.S. PATENT DOCUMENTS

| | | | |
|---|---|---|---|
| 8,630,597 B2 * | 1/2014 | Lee ...................... | H04B 1/0458 343/822 |
| 2015/0029922 A1* | 1/2015 | Zheng ............... | H04W 52/0216 370/311 |
| 2015/0043685 A1* | 2/2015 | Choi ....................... | H04L 5/143 375/346 |
| 2015/0288475 A1* | 10/2015 | Tabet ................... | H04J 11/0079 370/252 |

* cited by examiner

*Primary Examiner* — Khai Tran
(74) *Attorney, Agent, or Firm* — Schwegman Lundberg & Woessner, P.A.

(57) ABSTRACT

Representative implementations of devices and techniques provide transmit power detection for an antenna of a wireless system having two or more transmit antennas. A correlation is reduced between a transmit signal of the antenna and signals from other antennas.

24 Claims, 3 Drawing Sheets

POWER SENSING IN WIRELESS SYSTEM

BACKGROUND

Many wireless terminals include two or more transmit antennas. Each antenna may include a separate transmit chain and power amplifier, where different signals are transmitted from the different antennas. Different signals may be transmitted from the different antennas due to the technology used (e.g., Multiple Input Multiple Output Antennas (MIMO)), to provide transmit diversity, for up-link spatial multiplexing, and the like. In such cases, the signals transmitted from the multiple antennas may be different due to pre-coding, although the data stream before the pre-coding may be the same.

One problem that can arise in multiple antenna wireless systems is signal coupling between antennas. For example, a portion of the transmitted signal from one antenna may be captured by another antenna. The "transmit leakage" from one antenna to another can cause problems if the transmit chains include power detection components. Power detection components may be used to determine the transmitted power output at each antenna, for example. The accuracy of power detection associated with an antenna may be reduced due to the coupling of stray or unwanted signals onto elements of the antenna, such as from an adjacent antenna, for example.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Representative implementations of devices and techniques provide transmit power detection for an antenna of a wireless system having two or more transmit antennas. To minimize errors in power detection, a correlation is reduced between a transmit signal of the antenna and signals from other antennas. The techniques and devices described may be applied to each antenna of the wireless system, providing accurate transmit power detection for each antenna.

In various implementations, a coupler is associated with each antenna, and is arranged to capture a transmit signal from the associated antenna. In some cases, the coupler captures signals originating from other antennas as well. For example, the coupler may unintentionally capture a portion of another signal from an adjacent antenna of the wireless system, when the other signal's "transmission footprint" encompasses the coupler.

In such a case, the power of the transmit signal captured at the coupler and the power of the other signal captured at the coupler may be added, and detected as a complex sum by power detection components. This can result in incorrect forward power detection for a desired antenna.

In an implementation, a delay element is arranged to differentiate the power of the transmit signal of its associated antenna from the power of the other signal captured by the coupler. For example, the delay element is arranged to apply a delay to the transmit signal, reducing a correlation between the transmit signal and the other signal captured by the coupler.

In a further implementation, a combiner is arranged to combine the delayed transmit signal with a combination signal comprising the transmit signal and the other signal to improve an accuracy of transmit signal power detection.

Various implementations, including techniques and devices, are discussed with reference to the figures. The disclosure illustrates the techniques and devices with reference to a wireless terminal device, such as a MIMO device. This is not intended to be limiting. The techniques and devices discussed may be applied to any of various communication device designs, circuits, and technologies, and remain within the scope of the disclosure.

Advantages of the disclosed techniques and devices are varied, and include improved accuracy of transmit power detection on each antenna of a multi-antenna wireless system, and thus improved control of output power to each antenna. Other advantages of the disclosed techniques may be apparent in the disclosure, based on the techniques and/or devices discussed.

Implementations are explained in more detail below using a plurality of examples. Although various implementations and examples are discussed here and below, further implementations and examples may be possible by combining the features and elements of individual implementations and examples.

Example Environment

Figure 1:
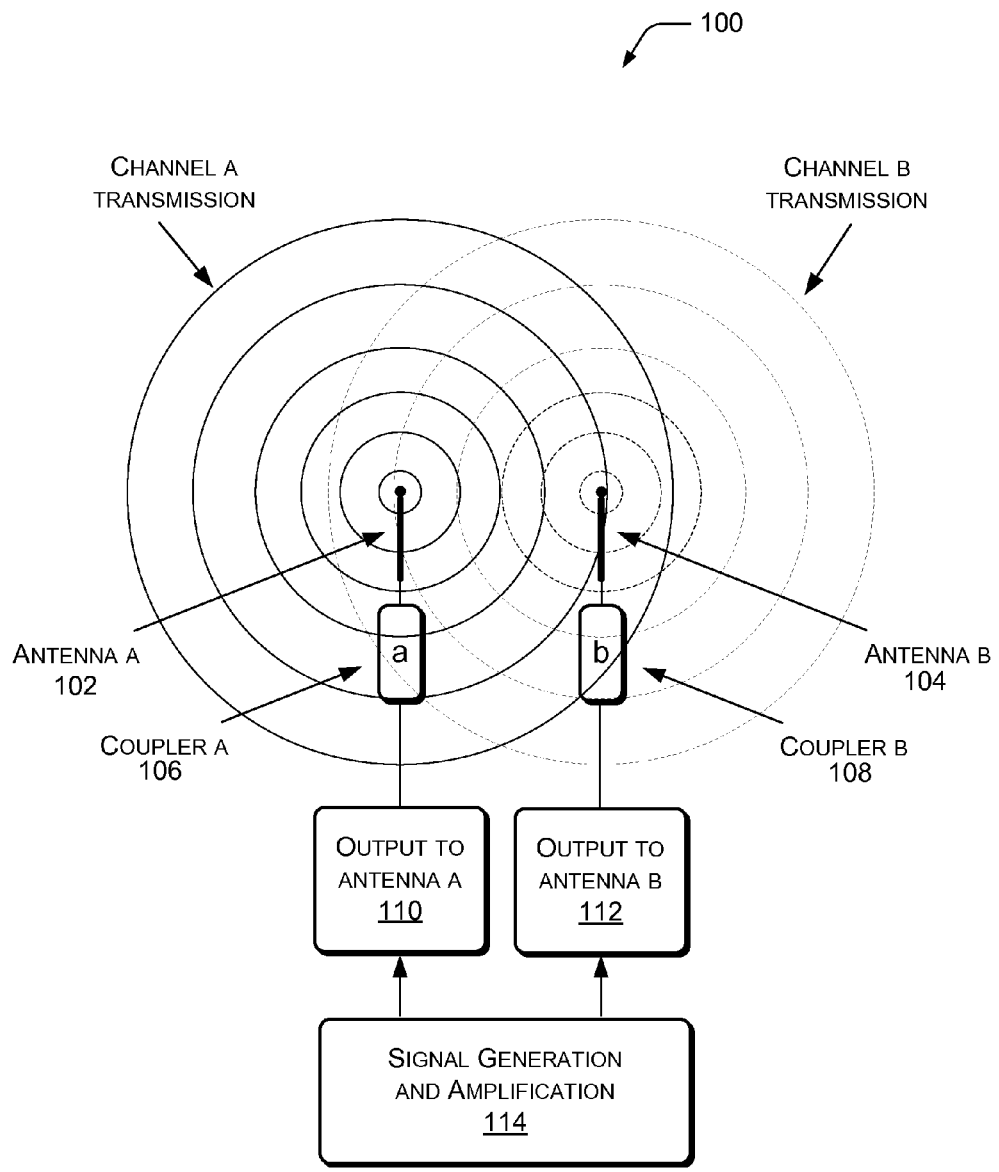
FIG. 1 is a block diagram of a portion of an example wireless terminal, in which the techniques in accordance with the present disclosure may be implemented.

FIG. 1 is a block diagram of a portion of an example wireless terminal system 100 ("system 100"), in which the techniques in accordance with the present disclosure may be implemented. As shown in FIG. 1, the system 100 may include two or more transmit antennas (102, 104). In various implementations, the system may include three, four, or more transmit antennas (102, 104).

One or more of the transmit antennas (102, 104) may transmit a signal concurrently. For example, antenna A may transmit channel A transmission signal ("TX A"), shown by the solid concentric lines of FIG. 1, while antenna B transmits channel B transmission signal ("TX B"), illustrated with the dashed concentric lines of FIG. 1. In various implementations, TX A and TX B comprise different signals.

In an implementation, as shown in FIG. 1, the system 100 includes a coupler (106, 108) associated with an antenna (102, 104 respectively). The coupler is arranged to capture a transmit signal from the antenna it is associated to. For example, in the illustration of FIG. 1, coupler A 106 is associated with antenna A 102, and is arranged to capture a transmit signal TX A from antenna A. Also, coupler B 108 is associated with antenna B 104, and is arranged to capture a transmit signal TX B from antenna B 104. In various implementations, the signal captured by a coupler (106, 108) is used to determine a power output at the associated antenna (102, 104 respectively).

As shown in FIG. 1, a portion of the transmitted signal (e.g., TX B) from a second antenna (e.g., antenna B) may be unintentionally captured by a coupler (e.g., coupler A 106)

associated with a first antenna (e.g., antenna A 102). In other words, antenna A 102 may receive at least a portion of the signal TX B that is transmitted via antenna B 104. In the example illustrated, the "transmission footprint" of TX B encompasses at least a portion of coupler A 106. This may be referred to as a transmission leakage from the other antenna (e.g., antenna B). Leakage from the other antenna (e.g., antenna B) may be due to limited isolation of the coupler (e.g., coupler A 106) and/or non-ideal termination at a reverse coupler 106 port, for example. The leakage can result in the captured signal of TX A and the captured signal of TX B being combined at coupler A 106, for instance.

In an example, transmit power detection of an antenna (e.g., antenna A 102) is based on transmit signals captured at the associated coupler (e.g., coupler A 106). Power detection may be impaired by transmit leakage from the other antenna (e.g., antenna B 104). As a result, the accuracy of output power detection may be reduced, depending on the amount of transmit leakage.

In various implementations, the system 100 may include antenna output modules 110, 112 associated with antennas (102, 104 respectively) of the system 100. The output modules 110, 112 may include power detection circuits or components arranged to detect the power of the transmit signal(s) captured by the associated coupler (106, 108 respectively). For example, power detection circuitry may include a simple diode-based detector, a more complex feedback-based receiver, or the like.

In some examples, the output modules 110, 112 may include pre-coding circuits or components, providing signal coding such as space-time block coding, or the like, which may be different for each antenna 102, 104 of the system 100. Pre-coding may be used to improve signal-to-noise ratio, transmit signal diversity, and the like, with multi-antenna systems 100. The use of pre-coding may result in the transmit signals TX A and TX B being different, although the data stream before pre-coding may be similar or the same.

In various implementations, the system 100 may include a signal generation and amplification module 114. Such a module may include signal modulation, amplification, and the like, and may be similar or the same for each transmit antenna 102, 104 of the system 100.

Example Implementation

Figure 2:
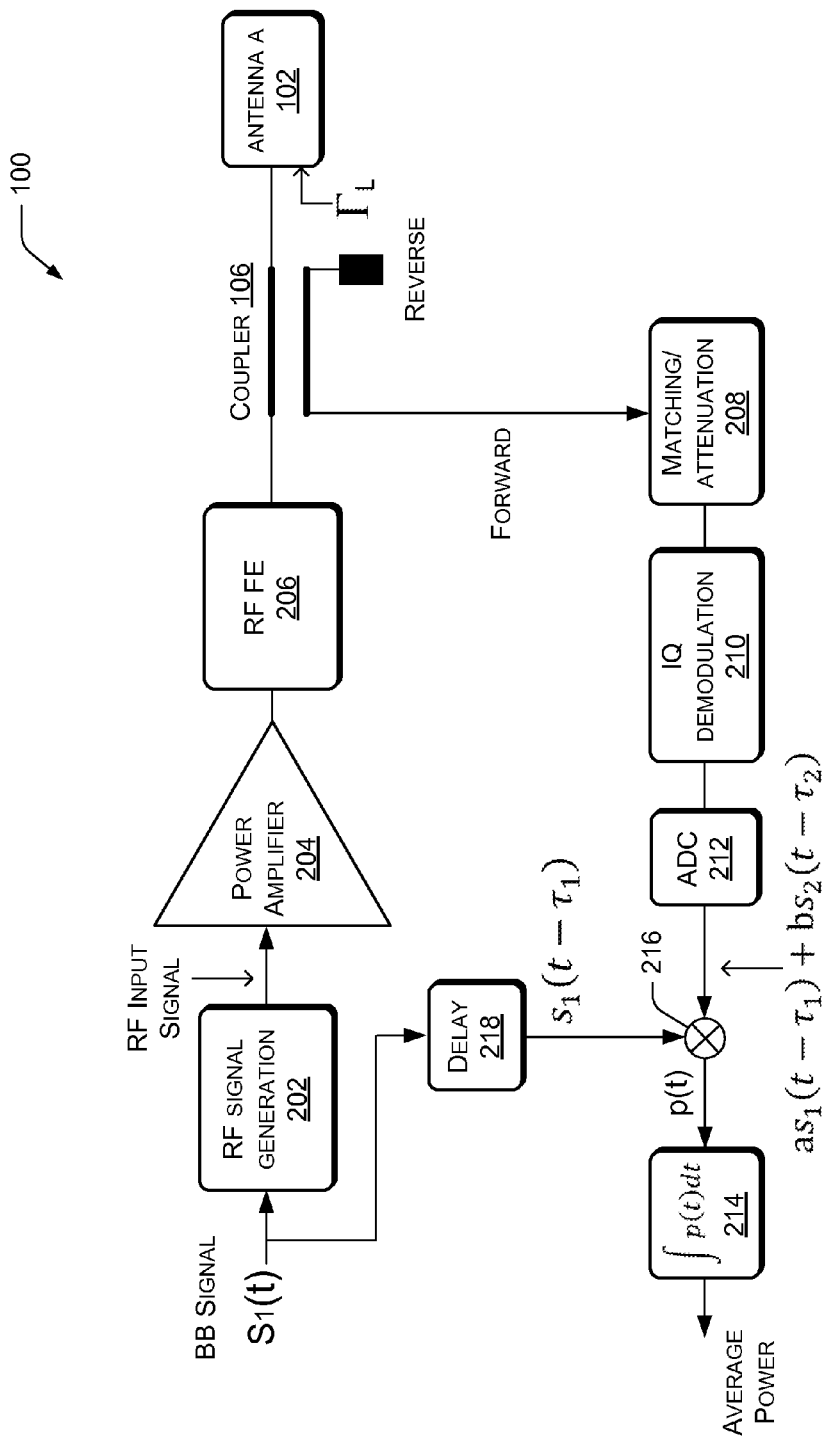
FIG. 2 is a schematic of an example wireless terminal, including, transmit power detection components, according to an implementation.

FIG. 2 is a schematic of an example wireless terminal (e.g., system 100), as described above, including transmit power detection components, according to an implementation. In an implementation, the example system 100 of FIG. 2 comprises a multiple-input-multiple-output (MIMO) mobile wireless terminal, including at least two antennas (102, 104), where the first antenna 102 and the second antenna 104 are arranged to transmit differently coded signals, as discussed above. Alternately, the system 100 may include at least one antenna 102, which may be subject to leakage transmissions from an antenna (antenna B 104) on another terminal device.

Referring to FIG. 2, The input signal $s_1(t)$ is to be transmitted via antenna A 102. In an implementation, the input signal $s_1(t)$ is converted from baseband to radio frequency (RF) at RF signal generation component 202 and then amplified by means of a power amplifier 204. The RF front end (FE) block 206 may include specified filtering (e.g. to reduce noise in a corresponding receive band and/or to meet 3GPP requirements in terms of spurious emissions, for example) and switching (e.g. to connect the desired transmit band to the associated antenna (e.g., antenna A 102), in case of a multiband terminal 100.

A gamma match ($\Gamma_L$) component is shown at antenna A 102, to couple and match the impedance of the transmission line of the antenna A 102 to the physical element(s) of the antenna A 102. The transmission line comprises the cable and/or other couplers that feed the transformed input signal $s_1(t)$ from the RF FE 206 (and/or other output module 110 components) to the antenna A 102. In an example, the gamma match $\Gamma_L$ component can work as a balun, or transformer, and can reduce common-mode noise as well as match impedance.

In various implementations, the transformed input signal $s_1(t)$ is transmitted (e.g., from antenna A 102) as transmit signal (e.g., TX A), for example. As discussed above, at least a portion of the transmit signal is captured by the directional coupler 106. In an implementation, a subsequent power control circuit can use the coupled forward power information to maintain a constant forward power from antenna A 102, for example.

In an example, simultaneous transmission at multiple antennas (e.g., antennas 102 and 104) could impair the power control accuracy due to leakage from the other antennas. As discussed above, in an example, transmission leakage from another source (such as antenna B 104, for example) may be coupled into the forward signal path at coupler 106. This may be due to limited coupler 106 isolation and/or non-ideal termination at the reverse port of the coupler 106, or the like. In the example, the leakage signal $s_2(t)$ may be added to the captured transmit signal $s_1(t)$ (e.g., TX A). The combined signals add voltage wise (e.g., complex addition), and may cause an incorrect forward power detection when calculating the average power transmitted from antenna A 102.

An example transmit power detection path, including detection circuits and/or components is shown in FIG. 2, and includes a matching/attenuation component 208, an IQ demodulation component 210, an analog-to-digital converter (ADC) 212, and an integrator (i.e., power detection component) 214. In an implementation, the integrator 214 is arranged to detect the power of signals captured by the coupler 106, for example. In alternate implementations, the detection path may include alternate or additional components arranged to organize information from the signal(s) captured at the coupler 106 and determine the forward power output of the transmit antenna (e.g., antenna A 102).

As shown in FIG. 2, at the output of the ADC 212, the "combination signal," including the transmit signal TX A (i.e., the transformed and transmitted input signal $s_1(t)$) and the unintentionally coupled other signal(s) (e.g., TX B or $s_2(t)$) can be expressed as:

$$as_1(t-\tau_1)+bs_2(t-\tau_2)$$

In the expression, $a*s_1(t)$ represents the desired transmit signal TX A which is transmitted via antenna A 102, where "a" is a scaling factor (e.g., due to coupling, IQ demodulator 210 gain, etc.). Also, $b*s_2(t)$ represents the transmission leakage TX B from the second antenna, antenna B 104, for example (or another source), where b is also a scaling factor that includes antenna coupling, coupler isolation, IQ demodulator 210 gain, etc.

In an implementation, one or more components may be included in the system 100 to reduce a correlation between the desired transmit signal $a*s_1(t)$ and the transmission leakage signal $b*s_2(t)$. For example, in an implementation as shown in FIG. 2, the transmit power detection path includes a combiner 216 arranged to combine a delayed version of the transmit signal $s_1(t-\tau_1)$ with the combination signal $as_1(t-\tau_1)+bs_2(t-\tau_2)$, comprising the portion of the transmit signal a*s₁(t) and the portion of the transmission leakage signal b*s₂(t). In an implementation, the combiner 216 is arranged to combine the signals such that the power of the portion of the transmission leakage signal s₂(t) captured by the coupler 106 is reduced at the power detection component 214. The result is that the forward power detection at the integrator 214 is more accurate, with the leakage signal s₂(t) component reduced or removed.

In an implementation, the combiner 216 provides a correlation reduction operation arranged to reduce the correlation between the input signal s₁(t) and the leakage signal s₂(t). In ideal case, when s₁(t) and s₂(t) are completely uncorrelated, the contribution from the transmission leakage signal s₂(t) may be completely removed. Due to the correlation operation, the signals (TX A and TX B) transmitted via the different antennas (102, 104) have a weak correlation, and the effect of the transmission leakage signal s₂(t) is suppressed. This can result in the output power detection being less corrupted and more accurate.

In an implementation, the correlation operation is used to minimize the output power error at one transmit antenna (e.g., antenna A 102) caused by transmission leakage from another antenna (e.g., antenna B 104). The correlation reduction operation may be expressed as shown:

$$\int s_1(t-\tau_1)[as_1(t-\tau_1)+bs_2(t-\tau_2)]dt = a\int [s_1(t-\tau_1)]^2 dt + b\int [s_1(t-\tau_1)][s_2(t-\tau_2)]dt = a\int [s_1(t-\tau_1)]^2 dt + 0$$

In an implementation, the multiplication of the combination signal as₁(t−τ₁)+bs₂(t−τ₂) with the delayed transmit signal s₁(t−τ₁) suppresses the transmission leakage s₂(t) from the other antenna (e.g., antenna B 104) when subsequently integrated at the integrator 214. In one implementation, the delay between the combination signal as₁(t−τ₁)+bs₂(t−τ₂) (or the leakage signal s₂(t)) and the delayed transmit signal s₁(t−τ₁) are adjusted to achieve an optimized correlation reduction.

In various implementations, the system 100 includes a delay component 218 arranged to apply the delay to the transmit signal s₁(t) when a portion of the leakage signal s₂(t) is captured by the coupler 106. In the implementations, the delay element 218 is arranged to differentiate the power of the transmit signal s₁(t) from the power of other signals (such as the leakage signal s₂(t), for example) captured by the coupler 106, by delaying the transmit signal s₁(t) by a predetermined duration with respect to the other signal(s) s₂(t). In this way, the delay element 218 is arranged to improve an accuracy of transmit signal power detection by the detection component 214.

In various implementations, the delay element 218 is arranged to delay the transmit signal s₁(t) by a predetermined duration via a delay value based on reducing a correlation between the transmit signal s₁(t) and the other signal s₂(t). In one implementation, the delay element 218 is arranged to estimate the delay value based on a correlation peak of the transmit signal s₁(t) and the other signal s₂(t). In other words, the delay element 218 is arranged to adjust the delay to the transmit signal s₁(t) to minimize a correlation between the transmit signal s₁(t) and the combination signal as₁(t−τ₁)+bs₂(t−τ₂) or the leakage signal s₂(t). The estimation calculation may be performed by a processor (not shown), or the like, for example.

In an additional or alternate implementation, the delay element 218 is arranged to select the delay value from a look up table of multiple predefined delay values. In the implementation, a set of delay values may be pre-calculated based on optimizing correlation reduction between the transmit signal s₁(t) and the combination signal as₁(t−τ₁)+bs₂(t−τ₂) or the leakage signal s₂(t), based on predefined steps or ranges, for example. The look up table including the set of delay values may be stored in a memory storage device (not shown), for example, or the like.

It is to be understood that a system 100 may be implemented as a separate component or as part of another system including a communication device, for example. The techniques and devices described herein with respect to a system 100 is not limited to the configurations shown in FIGS. 1 and 2, and may be applied to other configurations without departing from the scope of the disclosure. Various implementations of a system 100 as described herein, may include fewer components and remain within the scope of the disclosure. Alternately, other implementations of a system 100 may include additional components, or various combinations of the described components, and remain within the scope of the disclosure.

Representative Process

Figure 3:
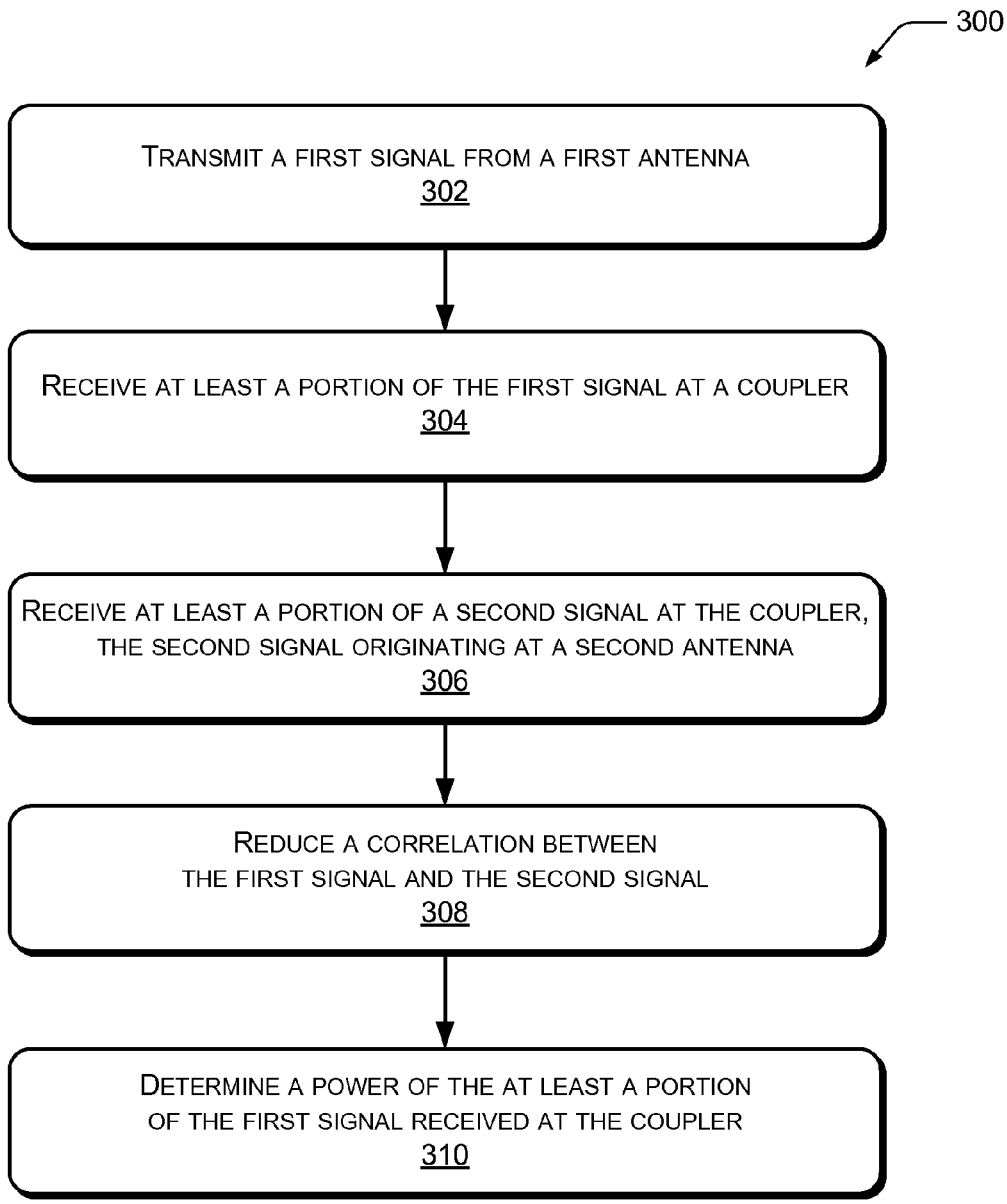
FIG. 3 is a flow diagram illustrating an example process of improving the accuracy of detected transmit power in a wireless system with multiple antennas, according to an implementation.

FIG. 3 illustrates a representative process 300 of improving the accuracy of detected transmit power in a wireless system (such as system 100, for example) with multiple antennas, according to an implementation. The process 300 includes reducing a correlation between a signal transmitted at a first antenna (such as antenna A 102, for example) and other signals from other sources (such as antenna B 104, for example), to more accurately detect the power of the signal transmitted at the first antenna. In an implementation, the correlation is reduced by delaying the signal at the first antenna. The process 300 is described with reference to FIGS. 1 and 2.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 302, the process includes transmitting a first signal from a first antenna (such as antenna A 102, for example). At block 304, the process includes receiving at least a portion of the first signal at a coupler (such as coupler 106, for example).

At block 306, the process includes receiving at least a portion of a second signal at the coupler, the second signal originating at a second antenna (such as antenna B 104, for example). In an example, the second signal is not necessarily intended to be received at the coupler. For instance, the coupler may be within a transmission footprint of the second signal, and the second signal may be coupled onto the coupler due to proximity and/or non-ideal connections, for example.

At block 308, the process includes reducing a correlation between the first signal and the second signal. In various implementations, the weaker the correlation between the first signal and the second signal, the better the accuracy in detecting the forward power associated with the first signal. In an ideal case, there is no correlation between the first and second signals, and the power of the second signal is suppressed during power detection. In the ideal case, only the desired first signal power is measured.

In an implementation, the process includes delaying the first signal by a first duration and combining the delayed first signal with a combination signal comprising at least a portion of the first signal and at least a portion of the second signal. For example, the combination signal may comprise the first signal and the other signal captured by the coupler. In the implementation, the signals (i.e., the delayed first signal and the combination signal) are combined to reduce the correlation between the first and second signals, thereby suppressing the power of the second signal, and thus determining the power of the portion of the first signal received at the coupler with greater accuracy.

For example, in an implementation, the process includes differentiating the first signal from the second signal via a delay component (such as delay element 218, for example) arranged to apply a delay value to the first signal with respect to the second signal. In one implementation, the process may include estimating the delay value by analyzing the combination signal comprising the portion of the first signal and the portion of the second signal for a correlation peak. The delay value may be calculated based on minimizing any correlation between the first and second signals, as indicated by any correlation peaks found during analysis.

In another implementation, the process includes selecting the delay value from a look up table of multiple predefined delay values. For example, the table may be populated with delay values calculated to minimize a correlation between the first and second signals. The delay values may be based on anticipated leakage signals, due to the application, for example. In an example, the look up table including the delay values may be stored on a computer-readable memory storage device, or the like.

In an implementation, the process includes adjusting the delay between the first signal and the second signal to improve the accuracy of transmit power detection. For example, the delay may be adjusted by the delay element, or the like, to optimize correlation reduction.

At block 310, the process includes determining the power of the portion of the first signal received at the coupler. In an implementation, the process includes determining the transmit power of the first signal transmitted by the first antenna based on determining the power of the portion of the first signal received at the coupler.

In an implementation, the process includes improving control of forward transmit power at the first antenna based on improving an accuracy of detected transmit power from the first antenna. For example, the process may include maintaining constant power output from the first antenna based on reducing the correlation between the first signal and the second signal, where the correlation reduction results in improved power detection accuracy.

In an implementation, the first antenna and the second antenna are arranged to transmit differently coded signals at a multiple-input-multiple-output (MIMO) wireless terminal, or the like.

In alternate implementations, other techniques may be included in the process in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. An apparatus, comprising:
a coupler arranged to capture a transmit signal from a first antenna;
a detection component arranged to detect a power of the transmit signal captured by the coupler;
a delay element arranged to differentiate the power of the transmit signal from a power of another signal captured by the coupler, the delay element arranged to delay the transmit signal by a predetermined duration with respect to the other signal; and
a combiner arranged to combine a delayed transmit signal with a combination signal comprising the transmit signal and the other signal to improve an accuracy of transmit signal power detection.

2. The apparatus of claim 1, wherein the delay element is arranged to delay the transmit signal by the predetermined duration via a delay value based on reducing a correlation between the transmit signal and the other signal.

3. The apparatus of claim 1, wherein the delay element is arranged to estimate the delay value based on a correlation peak of the transmit signal and the other signal.

4. The apparatus of claim 1, wherein the delay element is arranged to select the delay value from a look up table of multiple predefined delay values.

5. The apparatus of claim 1, wherein the delay element is arranged to improve an accuracy of transmit signal power detection by the detection component.

6. The apparatus of claim 1, wherein the detection component comprises a diode-based detector or a feedback-based receiver.

7. A wireless communication system, comprising:
a first antenna arranged to transmit a first signal;
a second antenna arranged to transmit a second signal;
a coupler associated with the first antenna and arranged to capture a portion of the first signal;
a power detection component arranged to detect a power of signals captured by the coupler;
a delay element arranged to apply a delay to the first signal when a portion of the second signal is captured by the coupler; and
a combiner arranged to combine a delayed first signal with a combination signal comprising the portion of the first signal and the portion of the second signal, such that a power of the portion of the second signal captured by the coupler is reduced at the power detection component.

8. The wireless communication system of claim 7, wherein the delay element is arranged to adjust the delay to the first signal to minimize a correlation between the first signal and the combination signal.

9. The wireless communication system of claim 7, wherein the wireless communication device comprises a multiple-input-multiple-output (MIMO) mobile wireless terminal, and the first antenna and the second antenna are arranged to transmit differently coded signals.

10. A method, comprising:
transmitting a first signal from a first antenna;
receiving at least a portion of the first signal at a coupler;
receiving at least a portion of a second signal at the coupler, the second signal originating at a second antenna;
reducing a correlation between the first signal and the second signal; and
determining a power of the at least a portion of the first signal received at the coupler.

11. The method of claim 10, further comprising adjusting a delay between the first signal and the second signal to improve an accuracy of transmit power detection.

12. The method of claim 10, further comprising delaying the first signal by a first duration and combining the delayed first signal with a combination signal comprising the at least a portion of the first signal and the at least a portion of the second signal to determine the power of the at least a portion of the first signal received at the coupler.

13. The method of claim 10, further comprising determining a transmit power of the first signal based on determining the power of the at least a portion of the first signal received at the coupler.

14. The method of claim 10, further comprising improving control of forward transmit power at the first antenna based on improving an accuracy of detected transmit power from the first antenna.

15. The method of claim 10, further comprising maintaining constant power output from the first antenna based on reducing the correlation between the first signal and the second signal.

16. The method of claim 10, further comprising differentiating the first signal from the second signal via a delay component arranged to apply a delay value to the first signal with respect to the second signal.

17. The method of claim 16, further comprising estimating the delay value by analyzing a combination signal comprising the at least a portion of the first signal and the at least a portion of the second signal for a correlation peak.

18. The method of claim 16, further comprising selecting the delay value from a look up table of multiple predefined delay values.

19. The method of claim 10, wherein the first antenna and the second antenna are arranged to transmit differently coded signals at a multiple-input-multiple-output (MIMO) wireless terminal.

20. An apparatus, comprising:
a coupler arranged to capture a transmit signal from a first antenna;
a detection component arranged to detect a power of the transmit signal captured by the coupler;
a delay element arranged to differentiate the power of the transmit signal from a power of another signal captured by the coupler, the delay element arranged to delay the transmit signal by a predetermined duration with respect to the other signal; and
wherein the delay element is arranged to delay the transmit signal by the predetermined duration via a delay value based on reducing a correlation between the transmit signal and the other signal.

21. An apparatus, comprising:
a coupler arranged to capture a transmit signal from a first antenna;
a detection component arranged to detect a power of the transmit signal captured by the coupler;
a delay element arranged to differentiate the power of the transmit signal from a power of another signal captured by the coupler, the delay element arranged to delay the transmit signal by a predetermined duration with respect to the other signal; and
wherein the delay element is arranged to estimate the delay value based on a correlation peak of the transmit signal and the other signal.

22. An apparatus, comprising:
a coupler arranged to capture a transmit signal from a first antenna;
a detection component arranged to detect a power of the transmit signal captured by the coupler;
a delay element arranged to differentiate the power of the transmit signal from a power of another signal captured by the coupler, the delay element arranged to delay the transmit signal by a predetermined duration with respect to the other signal; and
wherein the delay element is arranged to select the delay value from a look up table of multiple predefined delay values.

23. An apparatus, comprising:
a coupler arranged to capture a transmit signal from a first antenna;
a detection component arranged to detect a power of the transmit signal captured by the coupler;
a delay element arranged to differentiate the power of the transmit signal from a power of another signal captured by the coupler, the delay element arranged to delay the transmit signal by a predetermined duration with respect to the other signal; and
wherein the delay element is arranged to improve an accuracy of transmit signal power detection by the detection component.

24. An apparatus, comprising:
a coupler arranged to capture a transmit signal from a first antenna;
a detection component arranged to detect a power of the transmit signal captured by the coupler;
a delay element arranged to differentiate the power of the transmit signal from a power of another signal captured by the coupler, the delay element arranged to delay the transmit signal by a predetermined duration with respect to the other signal; and
wherein the detection component comprises a diode-based detector or a feedback-based receiver.

* * * * *